United States Patent
Xin et al.

(10) Patent No.: US 11,606,164 B2
(45) Date of Patent: *Mar. 14, 2023

(54) MODULATION AND CODING FOR MULTIPLE RESOURCE UNITS IN WIRELESS NETWORK

(71) Applicant: HUAWEI TECHNOLOGIES CO., LTD., Shenzhen (CN)

(72) Inventors: Yan Xin, Ottawa (CA); Osama Aboul-Magd, Ottawa (CA); Jung Hoon Suh, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/466,895

(22) Filed: Sep. 3, 2021

(65) Prior Publication Data

US 2021/0399827 A1    Dec. 23, 2021

Related U.S. Application Data

(63) Continuation of application No. 17/145,199, filed on Jan. 8, 2021, now Pat. No. 11,115,149.

(60) Provisional application No. 62/959,603, filed on Jan. 10, 2020.

(51) Int. Cl.
*H04L 1/00* (2006.01)
*H04L 27/26* (2006.01)
*H04W 84/12* (2009.01)

(52) U.S. Cl.
CPC ........ *H04L 1/0003* (2013.01); *H04L 27/2601* (2013.01); *H04W 84/12* (2013.01)

(58) Field of Classification Search
CPC ... H04L 1/0003; H04L 27/2601; H04W 84/12
USPC ........................................................ 375/260
See application file for complete search history.

(56) References Cited

U.S. PATENT DOCUMENTS

| | | | |
|---|---|---|---|
| 8,223,704 B2 * | 7/2012 | Hwang | H04L 5/0032 370/335 |
| 11,115,149 B2 * | 9/2021 | Xin | H04L 1/0015 |
| 2004/0174856 A1 | 9/2004 | Brouet et al. | |
| 2006/0078001 A1 | 4/2006 | Chandra et al. | |
| 2008/0159220 A1 | 7/2008 | Kitchin et al. | |
| 2009/0290544 A1 | 11/2009 | Yano et al. | |

(Continued)

FOREIGN PATENT DOCUMENTS

| | | |
|---|---|---|
| WO | 2015081132 A1 | 6/2015 |
| WO | 2017036246 A1 | 3/2017 |

OTHER PUBLICATIONS

IEEE 802.11-18/1231r06, 802.11 EHT Proposed PAR Jan. 11, 2019.

(Continued)

*Primary Examiner* — Fitwi Y Hailegiorgis

(57) ABSTRACT

Methods and devices for transmitting data in an Orthogonal Frequency-Division Multiple Access (OFDMA) wireless local area network, comprising: selecting, for a first resource unit assigned to the target station, a first modulation type; selecting, for a second resource unit assigned to the target station, a second modulation type different from the first modulation type; and modulating coded data and mapping the modulated data onto subcarriers associated with the assigned resource units based on the respective modulation types selected for each of the assigned resource units.

22 Claims, 9 Drawing Sheets

(56) References Cited

U.S. PATENT DOCUMENTS

2011/0249644 A1* 10/2011 Boariu ................ H04W 72/042
  455/450
2017/0164351 A1   6/2017 Ghosh et al.
2017/0272138 A1   9/2017 Chun et al.

OTHER PUBLICATIONS

IEEE 802.11-19/1907r0, Multiple RU combinations for EHT May 15, 2019.
3rd Generation Partnership Project (3GPP), Technical Specification 36.213: E-UTRA; Physical Layer Procedures.
3rd Generation Partnership Project (3GPP), Technical Specification 36.211: E-UTRA; Physical Channel and Modulation.
3rd Generation Partnership Project (3GPP), Technical Specification 38.214: NR; Physical Channel and Modulation.
3rd Generation Partnership Project (3GPP), Technical Specification 36.212: E-UTRA; Multiplexing and Channel Coding.
3rd Generation Partnership Project (3GPP), Technical Specification 38.212: NR; Multiplexing and Channel Coding.
IEEE 802.11-19/1869r0, Preamble puncturing and RU aggregation.
Begonya Otal et al, Merged Partial Proposal to IEEE 802.11 TGn regarding Multiple Data Rate and Receiver Aggregation Nokia-Philips/Samsung, Nov. 2004, 11-04-1376-00-000N-NOKIA-PHILIPS-SAMSUNG MERGED MUL TIPLE-MCS-AND-RECEIVER-AGGREGATION-MMRA Proposal, IEEE-SA Mentor, Piscataway, NJ USA, vol. 802.11 n, XP017689991, Nov. 5, 2004.

* cited by examiner

IEEE 802.11ax: HE-MCSs for 26-tone RU, $N_{SS}$ = 6

| HE-MCS Index | DCM | Modulation | R | $N_{BPSCS}$ | $N_{SD}$ | $N_{CBPS}$ | $N_{DBPS}$ | Data rate (Mb/s) | | |
|---|---|---|---|---|---|---|---|---|---|---|
| | | | | | | | | 0.8 μs GI | 1.6 μs GI | 3.2 μs GI |
| 0 | N/A | BPSK | 1/2 | 1 | 24 | 144 | 72 | 5.3 | 5.0 | 4.5 |
| 1 | N/A | QPSK | 1/2 | 2 | 24 | 288 | 144 | 10.6 | 10.0 | 9.0 |
| 2 | N/A | QPSK | 3/4 | 2 | 24 | 288 | 216 | 15.9 | 15.0 | 13.5 |
| 3 | N/A | 16-QAM | 1/2 | 4 | 24 | 576 | 288 | 21.2 | 20.0 | 18.0 |
| 4 | N/A | 16-QAM | 3/4 | 4 | 24 | 576 | 432 | 31.8 | 30.0 | 27.0 |
| 5 | N/A | 64-QAM | 2/3 | 6 | 24 | 864 | 576 | 42.4 | 40.0 | 36.0 |
| 6 | N/A | 64-QAM | 3/4 | 6 | 24 | 864 | 648 | 47.6 | 45.0 | 40.5 |
| 7 | N/A | 64-QAM | 5/6 | 6 | 24 | 864 | 720 | 52.9 | 50.0 | 45.0 |
| 8 | N/A | 256-QAM | 3/4 | 8 | 24 | 1152 | 864 | 63.5 | 60.0 | 54.0 |
| 9 | N/A | 256-QAM | 5/6 | 8 | 24 | 1152 | 960 | 70.6 | 66.7 | 60.0 |
| 10 | N/A | 1024-QAM | 3/4 | 10 | 24 | 1440 | 1080 | 79.4 | 75.0 | 67.5 |
| 11 | N/A | 1024-QAM | 5/6 | 10 | 24 | 1440 | 1200 | 88.2 | 83.3 | 75.0 |

FIG. 2 (Prior Art)

MODULATION AND CODING FOR MULTIPLE RESOURCE UNITS IN WIRELESS NETWORK

CROSS-REFERENCE TO RELATED APPLICATIONS

The present application is a continuation of U.S. patent application Ser. No. 17/145,199 filed Jan. 8, 2021, entitled "MODULATION AND CODING FOR MULTIPLE RESOURCE UNITS IN WIRELESS NETWORK" and claims the benefit of and priority to U.S. Provisional Patent Application No. 62/959,603 filed Jan. 10, 2020, entitled "MODULATION AND CODING FOR MULTIPLE RESOURCE UNITS IN WIRELESS NETWORK", the contents of which are incorporated herein by reference.

TECHNICAL FIELD

The present application relates to mobile air interface technologies, in particular to methods and systems for modulating and coding data for transmission in a wireless network.

BACKGROUND

Networks that operate according to Wi-Fi protocols, including IEEE 802.11 protocols such as the IEEE 802.11ax specified in IEEE Draft P802.11ax_D6.0, use defined modulation and coding schemes (MCSs) that specify properties used for physical layer modulation and encoding.

A new protocol, IEEE 802.11be, is currently under development by IEEE 802.11 Task Group TGbe, and will be the next major IEEE 802.11 amendment to define the next generation of Wi-Fi after IEEE 802.11ax (currently IEEE Draft P802.11ax_D6.0). IEEE 802.11be (also called Extremely High Throughput (EHT)) is expected to support a data rate of at least 30 Gbps and may use a spectrum bandwidth up to 320 MHz for unlicensed operations, double the 160 MHz maximum bandwidth currently contemplated by IEEE 802.11ax.

IEEE 802.11ax supports Orthogonal Frequency-Division Multiple Access (OFDMA) transmission, in which data intended for different stations can be multiplexed within an OFDM symbol through the allocation of different subsets of subcarriers (tones). In IEEE 802.11ax, a Resource Unit (RU) includes a group of contiguous subcarriers defined in the frequency domain. Different RUs can be assigned to different stations within a PHY protocol data unit (PPDU). Each RU is used for one OFDM symbol for one station (also referred to as a STA). FIG. 1 illustrates an example of station (STA) resource allocation in IEEE 802.11ax. In the allocated RU, the MCS for each station is the same across all the OFDM symbols (i.e., a single MCS is used for each station) within one PPDU. The MCSs used for RUs for different stations can be different within one PPDU.

In IEEE 802.11ax, RUs are defined based on RU sizes such as 26-tone RU, 52-tone RU, 106-tone RU, 242-tone RU, 484-tone RU, 996-tone RU and 2×996-tone RU. Information about the RU assigned to a station, such as the RU location and the RU size, and the modulation and coding scheme (MCS) for the data transmitted over the assigned RU, are indicated in the HE-SIG-B field of the physical layer (PHY) protocol data unit (PPDU) in IEEE 802.11ax. The MCS information is provided in the form of an MCS index that specifies a set of physical layer properties including modulation and forward error correction (FEC) coding rate R. By way of illustrative example, FIG. 2 illustrates the examples of MCSs specified in IEEE 802.11ax for the case of a 26-tone RU where the number of spatial streams Nss=6.

Under IEEE 802.11ax, the MCS used for an RU is determined based on the channel conditions for the data transmission. In particular, channel conditions are measured and averaged over all resources assigned for a station, and the average result used to select an appropriate MCS.

As indicated above, IEEE 802.11be will support a wide bandwidth, up to 320 MHz. The larger bandwidth introduces opportunities and issues that are not present in a narrower bandwidth system. For example, EHT enabled Wi-Fi should enable a significant growth in the volume of high throughput data transmission as well as a proliferation of an extremely large number of low data rate devices such as Internet of Things (IoT) devices. However, as a result of the anticipated deployment density, the probability of a single station having access to a large number of contiguous subcarriers within the 320 MHz bandwidth at any given time can be expected to be low. In this regard, an operating feature called multiple RUs (multi-RU) has been proposed for IEEE 802.11be, in which multiple RUs that each have a respective sub-set of contiguous subcarriers can be allocated for one station in an OFDM symbol.

Channel conditions for an OFDM symbol may have greater variance across a wide bandwidth than for a narrow bandwidth. For example, it is highly possible that the interference levels for subsets of subcarriers may be significantly different across the whole bandwidth, especially for subcarriers that are separated far apart in frequency domain.

Accordingly, there is a need for further development of modulation and coding schemes that can be applied to optimize channel efficiency in large bandwidth multi-RU applications.

SUMMARY

According to a first example aspect is a method of transmitting data in an Orthogonal Frequency-Division Multiple Access (OFDMA) wireless local area network. The method includes selecting, for a first resource unit assigned to the target station, a first modulation type; selecting, for a second resource unit assigned to the target station, a second modulation type different from the first modulation type; and modulating coded data and mapping the modulated data onto subcarriers associated with the assigned resource units based on the respective modulation types selected for each of the assigned resource units.

In some examples, such a method can enable different modulation types to be used for different sets of sub-carriers assigned to a single target station, thereby allowing differences in channel conditions between the two sets of subcarriers to be addressed without resorting to the lowest common denominator. This can enable more efficient use of computational resources at a transmit station and target station and more efficient use of network resources within the WLAN network.

In some examples, the method includes selecting, for each of the first resource unit and second resource unit assigned to the target station, a respective code rate, and prior to modulating the data, encoding the data based on the respective code rates selected for each of the first and second resource units.

In some examples, the method includes determining link conditions for the subcarriers associated with each of the first and second resource units, wherein the selecting the respective modulation types is based on the link conditions. In some examples, selecting the respective code rates is based on the link conditions.

In some examples, the method includes putting information about the respective modulation types selected for the resource units in a header of the data unit.

In some examples, the method includes putting information about the respective code rates selected for the resource units in a header of the data unit.

According to a second example aspect is a method of transmitting a data unit in a wireless local area network, the data unit comprising a physical payload that includes an Orthogonal Frequency-Division Multiplexing (OFDM) symbol that comprises a plurality of resource units used for data modulated according to a respective modulation type, wherein the resource units include first and second resource units intended for a same receiving station and further resource units intended for one or more further receiving stations, the data unit comprising a header that includes, individually for each of the first and second resource unit, information identifying the respective modulation types used to modulate the data of the first and second resource units, respectively.

According to a third example aspect is a method of receiving a data unit in wireless local area network, the data unit comprising a physical payload that includes an Orthogonal Frequency-Division Multiplexing (OFDM) symbol that comprises a plurality of resource units used for data modulated according to a respective modulation type, wherein the resource units include a first and second resource unit intended for a same receiving station and further resource units intended for one or more further receiving stations, the data unit comprising a header that includes, individually for each of the first and second resource units, information identifying the respective modulation types used to modulate the data of the first and second resource units, respectively.

In some examples of the second and third example aspects, the header includes individual subfields for each of the first and second resource units for the information identifying the respective modulation typed used to modulate the data of the first and second resource units. In some examples, the header also includes, individually for each of the first and second resource units, information identifying a respective code rate used to encode the data carried by the first and second resource units, wherein the information identifying the modulation type and the information identifying the code rate are specified by a modulation and coding scheme (MCS).

According to a fourth example aspect is a method of transmitting data in an Orthogonal Frequency-Division Multiple Access (OFDMA) wireless local area network (WLAN), comprising: selecting, for a first resource unit assigned to a target station, a first modulation type; selecting, for a second resource unit assigned to the target station, a second modulation type different from the first modulation type; parsing input data for the target station into a first data stream and a second data stream; modulating, using the first modulation type, data included in the first data stream and mapping the modulated data onto a first set of subcarriers associated with the first resource unit; modulating, using the second modulation type, data included in the second data stream and mapping the modulated data onto a second set of subcarriers associated with the second resource unit; and transmitting, in the WLAN, an orthogonal frequency division multiplexing (OFDM) symbol including the data modulated onto the first set of subcarriers and the data modulated onto the second set of subcarriers.

In some examples of the fourth example aspect, the first set of subcarriers is separated in frequency from the second set of subcarriers by a plurality of intervening subcarriers.

In some examples of the fourth example aspect, the method includes determining link conditions in the WLAN for the first set of subcarriers and the second set of subcarriers, wherein the first modulation type is selected based on the link conditions for the first set of subcarriers and the second modulation type is selected based on the link conditions for the second set of subcarriers.

In some examples of the fourth example aspect, the method comprises, prior to parsing the input data for modulating, encoding the data according to a first code rate.

In some examples of the fourth example aspect, the method comprises selecting, for a first code rate for the first resource unit and a second code rate for the second resource unit; prior to modulating the data included in the first data stream, encoding the data included in the first data stream based on the first code rate; and prior to modulating the data included in the second data stream, encoding the data included in the second data stream based on the second code rate. In some examples, the method comprises determining link conditions in the WLAN for the first set of subcarriers and the second set of subcarriers, wherein the first modulation type and first code rate are selected based on the link conditions for the first set of subcarriers and the second modulation type and second code rate are selected based on the link conditions for the second set of subcarriers.

In some examples of the fourth example aspect, the first modulation type and the second modulation type are each selected from a group of modulation types that includes: binary phase shift keying (BPSK) modulation, quadrature phase shift keying (QPSK) modulation; 16-quadrature amplitude modulation (QAM); 64-QAM; 256-QAM; 1024-QAM; 2048-QAM; and 4096-QAM.

In some examples of the fourth example aspect, the OFDM symbol is transmitted as part of a data unit that includes information indicating the first modulation type, the first code rate, the second modulation type and the second code rate in a preamble header of the data unit.

In some examples of the fourth example aspect, the OFDM symbol is transmitted as part of a physical payload of a data unit, the data unit comprising a header that includes, individually for each of the first and second resource unit, information identifying the first set of subcarriers, the first modulation type, the second set of subcarriers and the second modulation type. In some examples, the header includes individual subfields for information identifying the first modulation type and the second modulation type.

According to a fifth example embodiment is a transmit station for transmitting data in an Orthogonal Frequency-Division Multiple Access (OFDMA) wireless local area network (WLAN), comprising: a network interface configured to send and receive signals in the WLAN; a processing device coupled to the network interface; a non-transitory storage coupled to the processing device and storing thereon instructions that, when executed by the processing device, configure the transmit station to: select, for a first resource unit assigned to a target station, a first modulation type; select, for a second resource unit assigned to the target station, a second modulation type different from the first modulation type; parse input data for the target station into a first data stream and a second data stream; modulate, using the first modulation type, data included in the first data stream and mapping the modulated data onto a first set of subcarriers associated with the first resource unit; modulate, using the second modulation type, data included in the second data stream and mapping the modulated data onto a second set of subcarriers associated with the second resource unit; and transmit, in the WLAN, an orthogonal frequency division multiplexing (OFDM) symbol including the data modulated onto the first set of subcarriers and the data modulated onto the second set of subcarriers.

According to a sixth example aspect is a method comprising:

receiving, at a receiving station, a data unit transmitted in wireless local area network (WLAN), the data unit comprising a physical payload that includes an Orthogonal Frequency-Division Multiplexing (OFDM) symbol that has been transmitted in a plurality of resource units used for data modulated according to a respective modulation type, wherein the resource units include a first and second resource unit assigned to the receiving station and further resource units assigned to one or more further receiving stations, the data unit comprising a header that includes, individually for each of the first and second resource units, information identifying the respective modulation types used to modulate the data transmitted in the first and second resource units, respectively. According to further example aspects is a non-transitory computer readable storage that stores instructions that when executed by a processor device of a station can configure the station to perform any of the methods of the preceding aspects.

According to a seventh aspect is a method of transmitting data in an Orthogonal Frequency-Division Multiple Access (OFDMA) wireless local area network (WLAN), including: parsing input data for transmission for a receiving station into a first data stream and a second data stream; modulating, using a first modulation type, data included in the first data stream and mapping the modulated data onto a first set of subcarriers associated with a first resource unit; modulating, using a second modulation type, data included in the second data stream and mapping the modulated data onto a second set of subcarriers associated with a second resource unit; and transmitting, in the WLAN, an orthogonal frequency division multiplexing (OFDM) symbol including the data modulated onto the first set of subcarriers and the data modulated onto the second set of subcarriers.

According to an eighth aspect is a station for transmitting data in an Orthogonal Frequency-Division Multiple Access (OFDMA) wireless local area network (WLAN), including: a network interface configured to send and receive signals in the WLAN; a processing device coupled to the network interface; a non-transitory storage coupled to the processing device and storing thereon instructions that, when executed by the processing device, configure the station to: parse input data for a receiving station into a first data stream and a second data stream; modulate, using a first modulation type, data included in the first data stream and map the modulated data onto a first set of subcarriers associated with a first resource unit; modulate, using a second modulation type, data included in the second data stream and map the modulated data onto a second set of subcarriers associated with a second resource unit; and transmit, in the WLAN, an orthogonal frequency division multiplexing (OFDM) symbol including the data modulated onto the first set of subcarriers and the data modulated onto the second set of subcarriers.

According to a ninth aspect is a method that includes: receiving, at a receiving station, a data unit transmitted in wireless local area network (WLAN), the data unit comprising a physical payload that includes an Orthogonal Frequency-Division Multiplexing (OFDM) symbol that has been transmitted in a plurality of resource units used for data modulated according to a respective modulation type, wherein the resource units include a first and second resource unit assigned to the receiving station and further resource units assigned to one or more further receiving stations, the data unit comprising a header that includes, for each of the first and second resource units, information identifying the respective modulation types used to modulate the data transmitted in the first and second resource units, respectively.

According to further example aspects is a station enabled for use in a wireless area local area network (WLAN), the station being configured to perform one or more of the above methods.

BRIEF DESCRIPTION OF THE DRAWINGS

Reference will now be made, by way of example, to the accompanying figures which show example embodiments of the present application, and in which:

FIG. 2 illustrates the examples of MCSs specified in IEEE 802.11ax for the case of a 26-tone RU where the number of spatial streams Nss=6.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems for transmitting data in a wireless network. Next generation wireless local area network (WLAN) systems, including for example next generation Wi-Fi systems such as the EHT system proposed under the developing IEEE 802.11be protocol, will have access to larger bandwidth. As noted above, a multi-RU feature has been proposed for IEEE 802.11be to allow multiple RUs to be allocated for one station in an OFDM symbol. However, existing proposals for multi-RU do not account for variations in link or channel conditions that may occur across the respective subcarrier groups allocated to the multiple RUs assigned to a particular station. As indicated above, under IEEE 802.11ax the MCS used for an RU is determined based on the link conditions for the data transmission. In particular, link conditions are measured and averaged over all resources assigned for a station, and the average result used to select an appropriate MCS. However, the use of a single MCS for all RUs assigned to a single station may be an inefficient solution in the context of multi-RU in which the different RUs assigned to a station may use respective sets of subcarriers that are spaced relatively far apart in frequency. Assuming that a single MCS applies to all RUs in the multi-RU, even if one single RU has a relatively lower signal-to-interference-plus-noise ratio (SINR) value and another RU has relatively larger SINR value(s), a transmitting station will select either an MCS that is suitable for the worst RU with the lowest SINR or an MCS that is lower than the MCS which is good for the best RU(s). An improved solution is to apply a flexible MCS selection, such that different RUs can have different MCS.

Accordingly, in example embodiments, in the case where multiple RUs are assigned to a single target station, MCS selection is performed independently for each of the multiple RUs. In example embodiments, MCS selection for each RU assigned to a station is based on the link or channel conditions for the subcarriers assigned to that particular RU.

Figure 3:
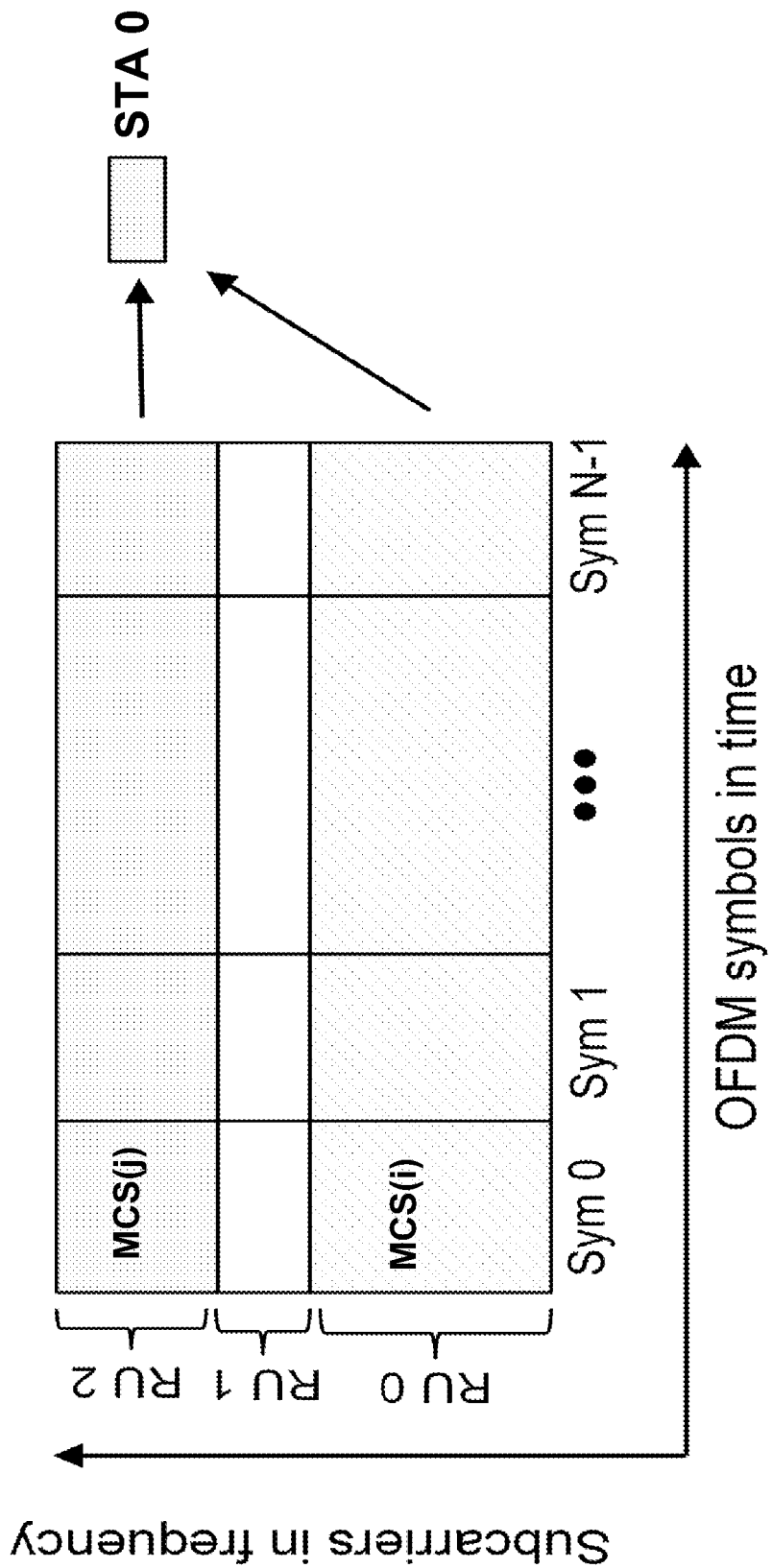
FIG. 3 shows an example of multiple RUs allocated to one station according to an example embodiment.

In this regard, FIG. 3 illustrates a representative example of multiple RUs assigned to a single station (STA 0) according to example embodiments. In the example of FIG. 3, the STA (STA 00) has been assigned two non-contiguous RUs, namely RU 0 and RU 2, in each of a plurality of OFDM symbols Sym 0 to Sym N−1 within a PPDU. A first MCS, namely MCS(i), is used for modulating and encoding data that is transmitted using the first RU 0, and a second MCS, namely MCS(j), is used to for modulating and encoding data that is transmitted using the second RU 2. In example embodiments, MCS(i) is selected for the first RU 0 based on the link conditions measured in respect of the set of subcarriers associated with RU 0, and MCS(j) is selected for the second RU 2 based on wireless channel conditions measured in respect of the set of subcarriers associated with RU 2.

The MCS selected for an RU specifies a defined set of properties used for physical layer encoding and modulating of data that is used for the RU. For example, for an RU having a specified number of tones (e.g. RU size=26, 52, 106, 242, 484, 996 tones), the MCS selected for that RU will specify the modulation type (e.g., binary phase shift keying (BPSK), quadrature phase shift keying (QPSK), 16-quadrature amplitude modulation (QAM), 64-QAM, 256-QAM, 1024-QAM, 2048-QAM, and 4096-QAM) and the forward error correction (FEC) coding rate (e.g., ½, ⅔, ¾, ⅚) that is used for the RU included in a PPDU. Examples of types of other properties that may be specified by the MCS are represented in the illustrative table of FIG. 2.

Figure 1:
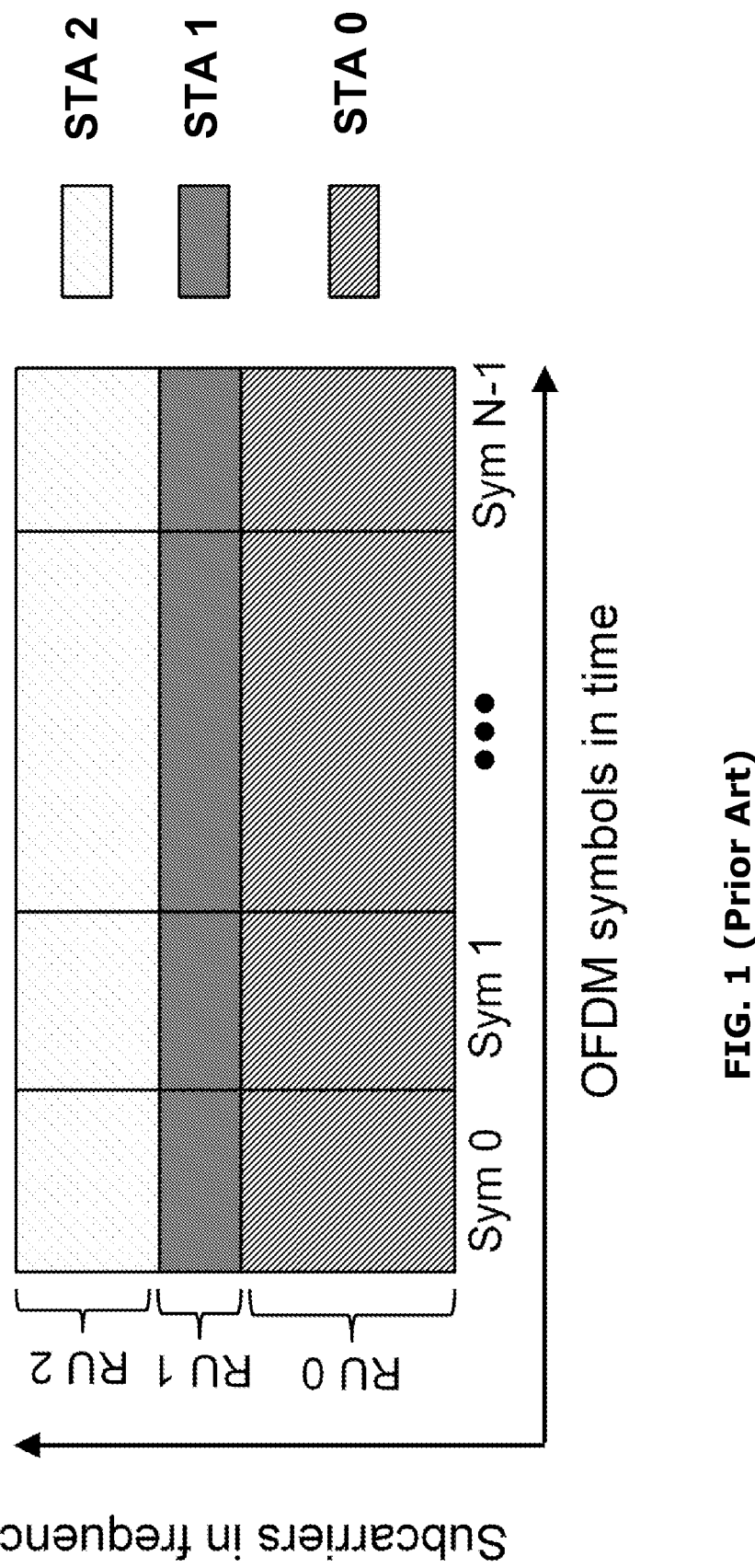
FIG. 1 illustrates an example of station (STA) resource allocation in 802.11ax.
Figure 4:
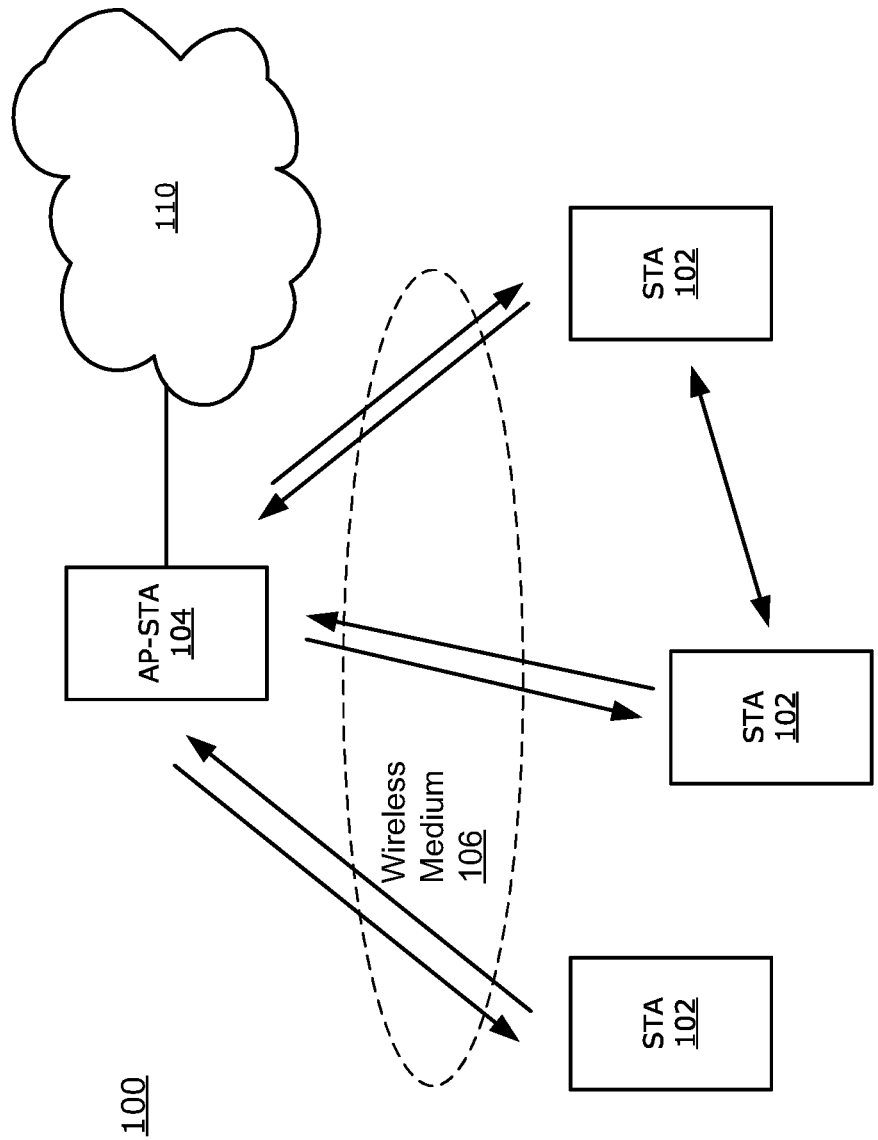
FIG. 4 is a block diagram illustrating an example communication network in accordance with one implementation of the present disclosure.

An example of an environment in which MCS selection can occur is illustrated in FIG. 4. FIG. 4 illustrates a communication network 100 comprising a plurality of stations (STAs) that can include fixed, portable, and moving stations. The example of FIG. 1 illustrates a single fixed STA, access-point station (AP-STA) 104, and a plurality of STAs 102 that may be portable or mobile. The network 100 may operate according to one or more communications or data standards or technologies, however in at least some examples the network 100 is a WLAN, and in at least some examples is a next generation Wi-Fi compliant network that operates in accordance with one or more protocols from the 802.11 family of protocols.

Each STA 102 may be a laptop, a desktop PC, PDA, Wi-Fi phone, wireless transmit/receive unit (WTRU), mobile station (MS), mobile terminal, smartphone, mobile telephone, sensor, internet of things (IOT) device, or other wireless enabled computing or mobile device. In some embodiments, a STA 102 comprises a machine which has the capability to send, receive, or send and receive data in the communications network 100 but which performs primary functions other than communications. The AP-STA 104 may comprise a network access interface which functions as a wireless transmission and/or reception point for STAs 102 in the network 100. The AP-STA 104 may be connected to a backhaul network 110 which enables data to be exchanged between the AP-STA 104 and other remote networks (including for example the Internet), nodes, APs, and devices (not shown). The AP-STA 104 may support communications through unlicensed radio frequency spectrum wireless medium 106 with each STA 102 by establishing uplink and downlink communication links or channels with each STA 102, as represented by the arrows in FIG. 1. In some examples, STAs 102 may be configured to communicate with each other. Communications in the network 100 may be unscheduled, scheduled by the AP-STA 104 or by a scheduling or management entity (not shown) in the network 100, or a mix of scheduled and unscheduled communications.

Figure 5:
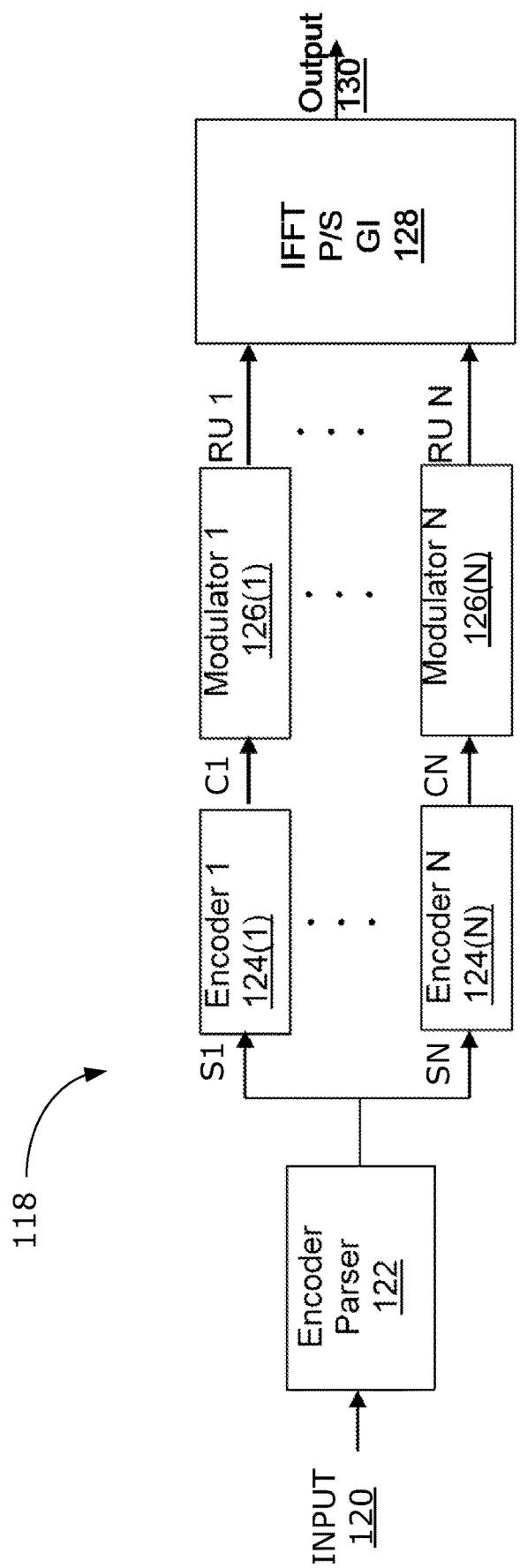
FIG. 5 is a block diagram illustrating components of a transmitter in accordance with one implementation of the present disclosure.

FIG. 5 illustrates an example of selected components of a transmitter 118 that may be present in a STA, for example AP-STA 104 according to example embodiments. In example embodiments, RUs have been allocated to use for data transmission among the multiple STAs 102, and multiple non-contiguous RUs (e.g., RUi and RUj) have been assigned to the same STA 102. In example embodiments, the AP-STA 104 acquires information about link conditions through the wireless medium 106 for the RUs assigned to STAs 102. Based on that information, the AP-STA 104 selects an optimal MCS for each RU from a predefined set of available MCSs. In an example embodiment, the link conditions for RUi and RUj are determined to be sufficiently different that a different optimal MCS (e.g. MCS(i) and MCS(j) is selected for RUi and RUj.

The transmitter 118 receives a serial stream of data bits as input 120. In example embodiments, the input 120 includes data bits that are to be included in the physical layer (PHY) payload (e.g., the PHY service data unit (PSDU) of a multi-RU physical layer (PHY) protocol data unit (PPDU)). An encoder parser 122 of the transmitter 118 parses the input data bits into N parallel data streams S1 to SN, each of which corresponds to a respective RU 1 to RU N. In example embodiment, at least two of the streams (e.g. Si and Sj) include data that is intended for the same receiving STA 102. FEC coding is applied to each of the data bit streams S1 to SN by respective FEC encoders 124(1) to 124(N). In example embodiments, data streams S1 to SN are each segmented into source words that are respectively FEC encoded into respective code words C1 to CN. The coding rate (e.g., ½, ⅔, ¾, ⅚) that is applied at each encoder 124(1) to 124(N) is determined by the MCS selected for the corresponding RU 1 to RU N. Accordingly, the code rate applied to the source words included in data streams Si and Sj are determined by the coding rates specified by MCS(i) and MCS(j), respectively, resulting in respective codewords Ci and Cj. Each of the code words C1 to CN is then modulated at a respective modulator 126(1) to 126(N) and mapped onto a respective set of subcarriers. Each set of subcarriers corresponds to a respective RU, i.e., RU 1 to RU N. In particular, code words C1 to CN are each mapped to respective sets of subcarriers or tones that correspond to RU 1 to RU N using a respective modulation constellation (e.g., BPSK, QPSK, 16-QAM, 64-QAM, 256-QAM, 1024-QAM, 2048-QAM, 4096-QAM). The modulation type applied at each of the respective modulators 126(1) to 126(N) is determined by the MCS selected for the corresponding RU 1 to RU N. Accordingly, the modulation applied to the code words $C_i$ and $C_j$ are determined by the modulation constellations specified by MCS(i) and MCS(j), respectively, resulting in respective resource units RU i and RU j.

In example embodiments, further processing operations 128 are applied to RU 1 to RU N to generate output 130. In example embodiments further processing operations 128 include an inverse fast Fourier transform (IFFT) operation on each of the subcarriers, followed by a parallel to serial (p/s) conversion and the addition of a guard interval (GI). The resulting output is a stream of OFDM symbols for inclusion in a PHY payload (e.g., PSDU) of a PPDU.

Figure 6:
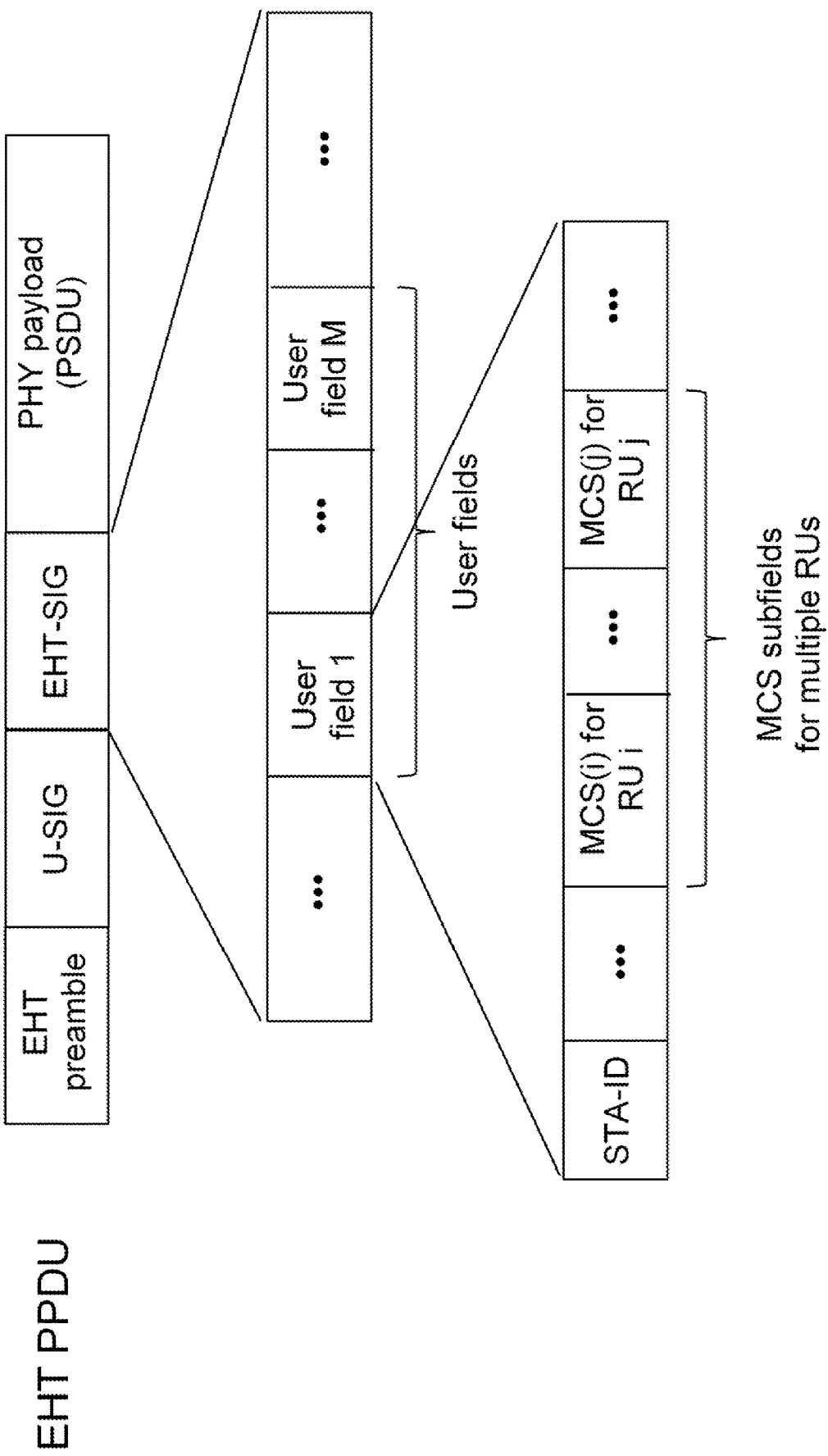
FIG. 6 illustrates example frame format for exchanging information through a wireless medium of the communication network of FIG. 4.

In example embodiments, the output 130, which corresponds to the data portion (e.g., PHY payload) of a PPDU, is appended to a PHY header to provide a PPDU that is modulated onto a carrier frequency and transmitted through wireless medium 106. In this regard, FIG. 6 illustrates an example frame format that may be used for an EHT PPDU according to example embodiments. As illustrated, the PHY header appended to the data portion (e.g., PHY payload) of a PPDU may include the following header fields: EHT preamble, U-SIG and EHT-SIG. In example embodiments, information about the RUs assigned to a STA, such as the RU location and the RU size, and the MCS selected for the data transmitted over the assigned RU, can be indicated in the EHT-SIG field of the PPDU. For example, the EHT-SIG field may include subfields for each STA 102 (e.g. User field 1 to User field M). Each user field can include subfields that specify: STA-ID that uniquely identifies the target STA, the RUs assigned to the target STA, and the MCSs used for each of the respective RUs assigned to the target STA (e.g., MCS(i) for RU i; MCS(j) for RU j).

In example embodiments, the MCS subfields can be populated with an MCS index value that maps to the specified MCS applied to the RU. For example, MCS values similar to the 4-bit MCS index values specified in IEEE 802.11ax can be used. In the case of IEEE 802.11ax, the 4-bit MCS index values each map to a respective set of MCS properties that specify both a coding rate and a modulation type.

In the example embodiment of FIG. 5, each RU in a multi-RU for a STA can use an independent code rate and modulation type. This embodiment may optimize the overall multi-RU performance by optimizing the performance of each RU. A large number of optimization options are made available through the application of MCSs to individual RUs based on the channel or link conditions specific to each RU.

In the case of a further example embodiment that will be described below, a common encoder can be used for all RUs for a specific target STA. In such cases, a common MCS field can be included in the header to indicate a base MCS for all RUs. The base MCS field will indicate the common code rate for all the RUs for a specific target STA. The header will further include RU specific MCS index subfields to indicate the modulation order or type for that specific RU. In this regard, the RU specific MCS index subfields may in some examples be shorter because rather than indicating an entire MCS option, the subfield need only identify one of the different possible modulation orders or types that can be used with the specified code rate (e.g., BPSK, QPSK, 16-QAM, 64-QAM, 256-QAM, 1024-QAM, 2048-QAM, 4096 QAM). For example, rather than requiring a 4-bit MCS index value in the subfield for each RU, the MCS index value for each RU can be shorter, for example 3 bits or fewer to indicate a difference in a modulation type relative to a base MCS that may be specified at another location in the header by a common 4-bit index for all RUs.

Figure 7:
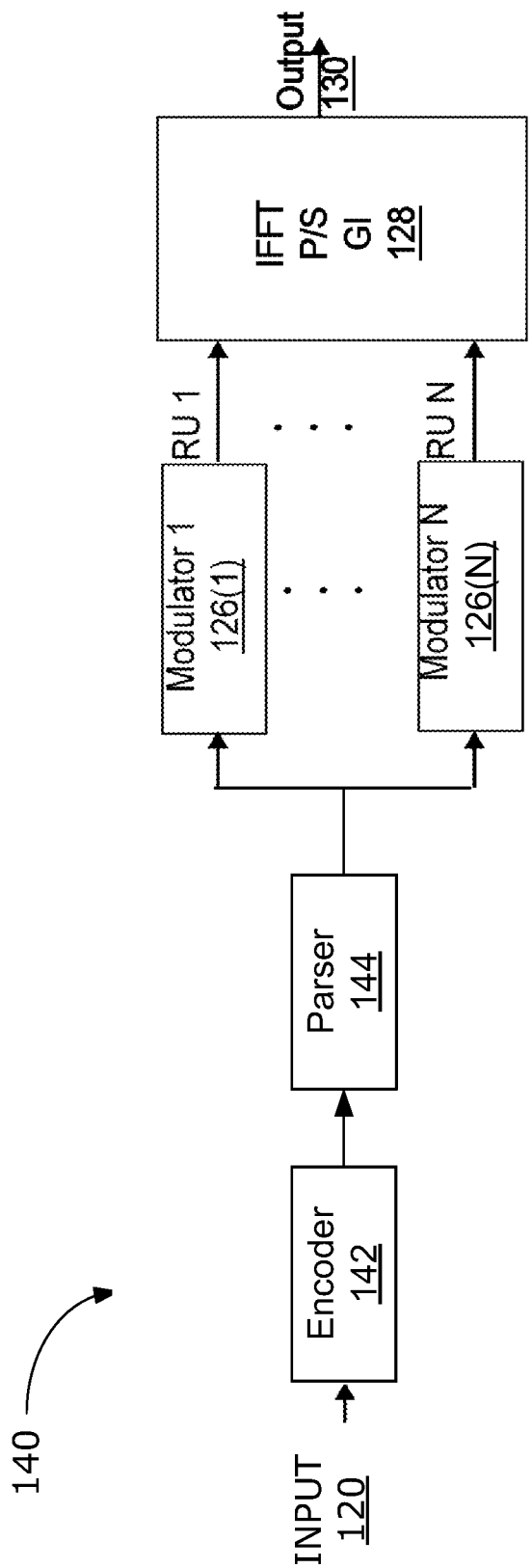
FIG. 7 is a block diagram illustrating components of a transmitter in accordance with a further implementation of the present disclosure.

In this regard, FIG. 7 illustrates an example of selected components of a further transmitter 140 that may be present in a STA, for example AP-STA 104 according to example embodiments. In example embodiments, transmitter 140 is identical in operation to transmitter 118 described above with the exception that transmitter 140 applies common FEC encoding with the same code rate to all RUs included in a PPDU. In the example of transmitter 140, the base MCS including the code rate may be selected based on the link condition across the entire ODFM symbol bandwidth, but the modulation type is selected based on the link condition for the bandwidth associated with each of the respective RUs.

In this regard, the transmitter 140 receives a serial stream of data bits as input 120 that are to be included in a PSDU of a multi-RU PPDU. Before parsing, FEC coding is applied to the data stream binary input 120 by a common FEC encoder 142. In example embodiments, the data stream is segmented into source words that are respectively FEC encoded into respective code words C1 to CN. The coding rate (e.g., ½, ⅔, ¾, ⅚) that is applied at encoder 142 is determined by a base MCS selected for all the RUs. A parser 144 then parses the codewords into N parallel streams, each of which corresponds to a respective RU 1 to RU N. In an example embodiment, at least two of the code word streams (e.g. C(i) and C(j)) include data that is intended for the same receiving STA 102. Each of the code word streams is then modulated at a respective modulator 126(1) to 126(N) and mapped onto a respective set of subcarriers corresponding to a respective RU (e.g., RU 1 to RU N). The modulation type applied at each of the respective modulators 126(1) to 126(N) is determined by a differential MCS (relative to the base MCS) selected based on the link conditions for the corresponding RU 1 to RU N.

Accordingly, in the example of FIG. 7, the code rate assigned for each RU in multi-RU for a STA is the same due to the use of a single encoder. However, the modulation type for each RU can be different, resulting in a possible use of different MCS for each RU. This embodiment may optimize the overall multi-RU performance by optimizing the performance of each RU based on the common encoding for multiple RUs and the corresponding individual modulation type. The embodiment of FIG. 7 enables a simplified implementation that can be achieved by using only single one encoder combined with variable modulation type to achieve possible different MCSs for each RU in multi-RU for a STA.

Figure 8:
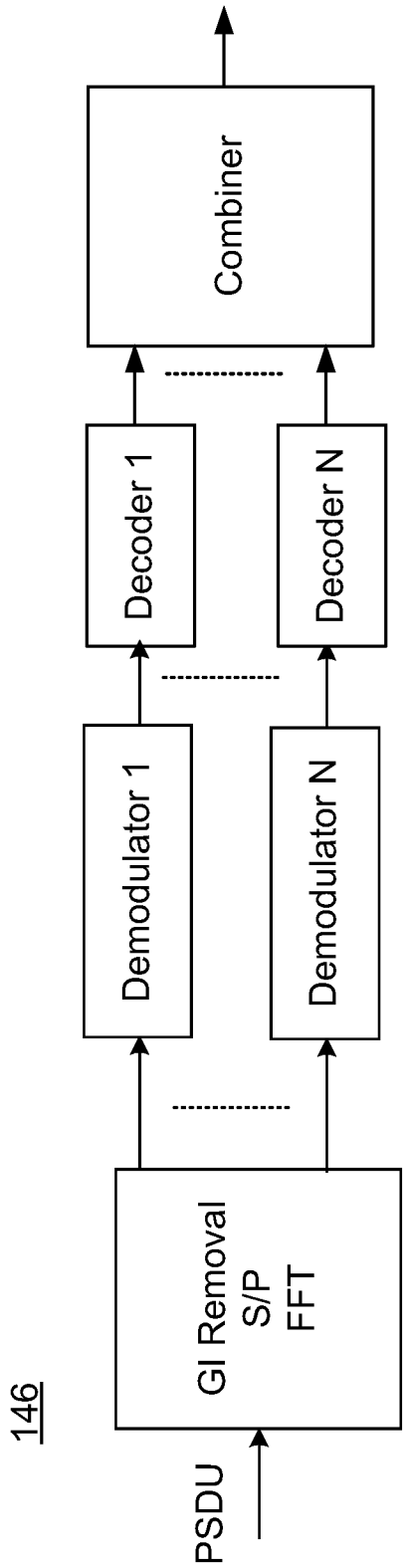
FIG. 8 is a block diagram illustrating components of a receiver in accordance with an implementation of the present disclosure.
Figure 9:
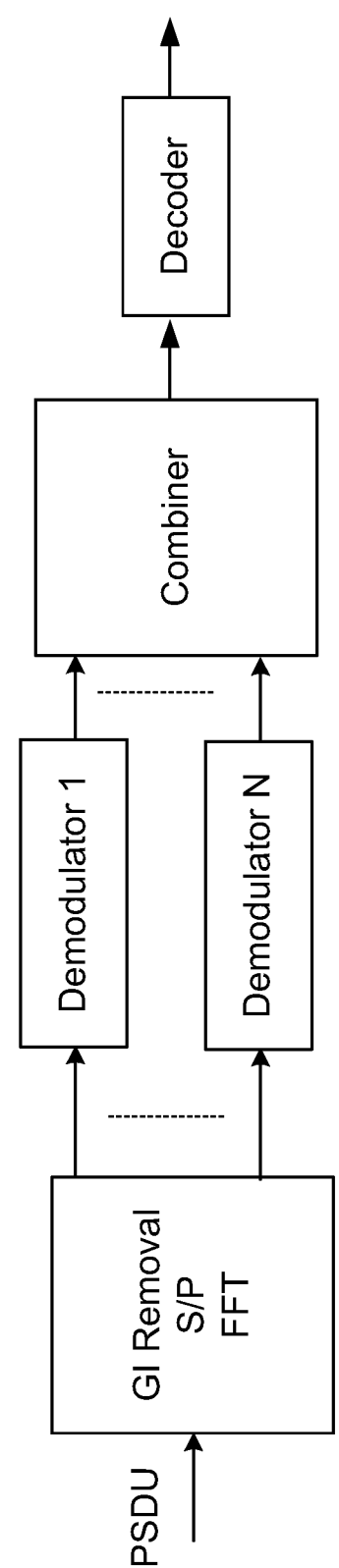
FIG. 9 is a block diagram illustrating components of a receiver in accordance with a further implementation of the present disclosure.

At a receiving STA, source words can be recovered by applying a process that is largely the inverse of that done at a receiving STA. For example, a receiving STA 102 can demodulate and decode the PHY header of a received PPDU to determine what RUs have been assigned to that STA 102 and the MCS applied to the RUs. The STA 102 can then demodulate the signals on the subcarrier sets belonging to the multiple RUs assigned to that STA 102 based on the modulation type indicated in the recovered MCS information. The demodulated RU signals can then be decoded to recover the source words based on the coding rate indicated in the recovered MCS information. FIG. 8 illustrates selected components of a receiver 146 that may be used to recover data from the data portion of a PPDU transmitted by transmitter such as transmitter 118 and FIG. 9 illustrates selected components of a receiver 148 that may be used to recover data from the data portion of a PPDU transmitted by transmitter such as transmitter 140.

Figure 10:
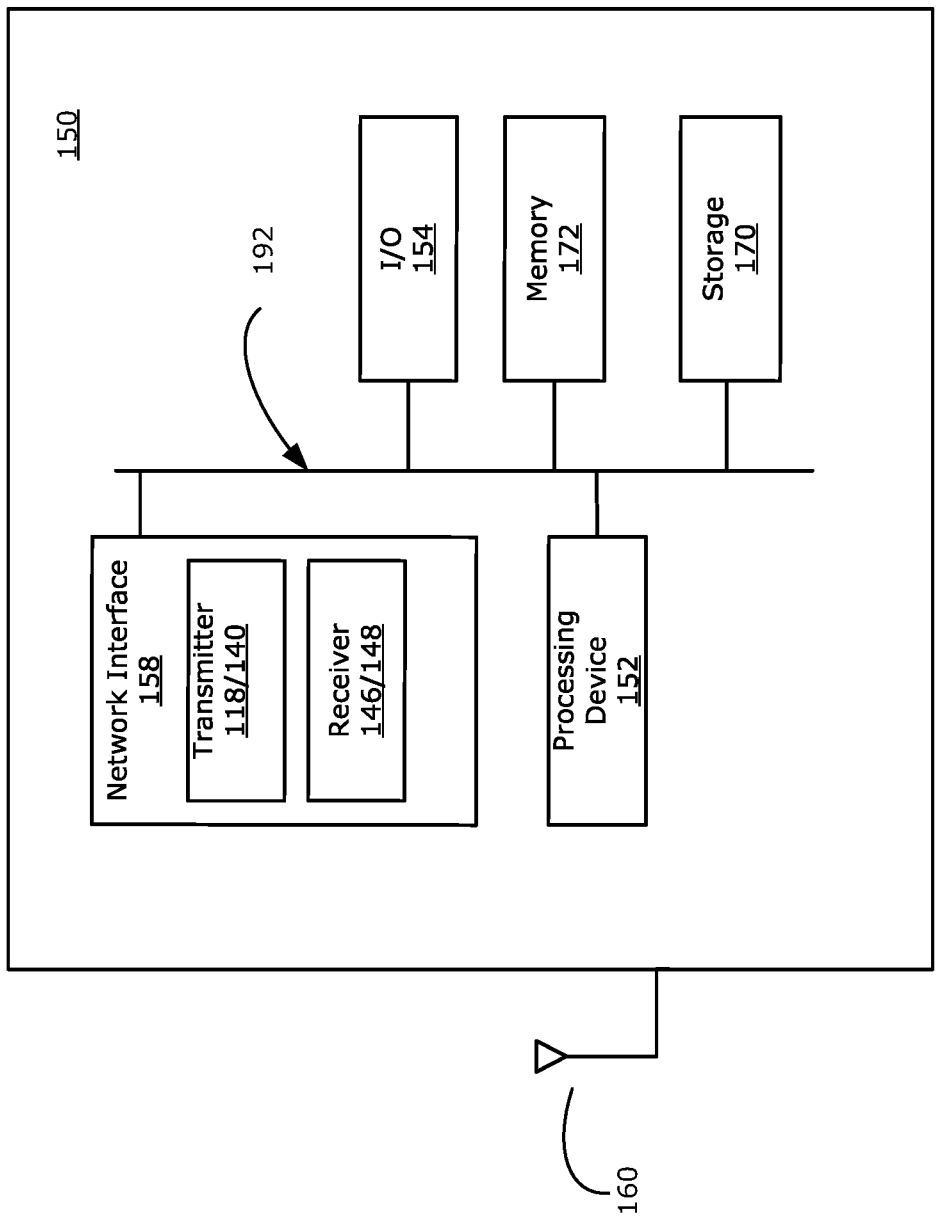
FIG. 10 is a block diagram illustrating a processing system which may be used in one or more stations of the communication network of FIG. 4 according to example embodiments.

FIG. 10 illustrates an example processing system 150, which may be used to implement methods and systems described herein, such as the STA 102 or the AP-STA 104. Other processing systems suitable for implementing the methods and systems described in the present disclosure may be used, which may include components different from those discussed below. Although FIG. 8 shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network. In example embodiments, network interfaces 158 include one or more wireless interfaces such as transmitters 118 or 140 and receiver 146 or 148 that enable communications in a WLAN such as network 100. The network interface(s) 158 may include interfaces for wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this regard, some network interface(s) 158 may include respective processing systems that are similar to processing system 150. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other STAs, user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 192 providing communication among components of the processing system 150, including the processing device(s) 152, I/O interface(s) 154, network interface(s) 158, storage unit(s) 170, memory(ies) 172. The bus 192 may be any suitable bus architecture including, for example, a memory bus, a peripheral bus or a video bus.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of transmitting data in an Orthogonal Frequency-Division Multiple Access (OFDMA) wireless local area network (WLAN), comprising:
   parsing input data for transmission for a receiving station into a first data stream and a second data stream;
   modulating, using a first modulation type, data included in the first data stream and mapping the modulated data onto a first set of subcarriers associated with a first resource unit;
   modulating, using a second modulation type, data included in the second data stream and mapping the modulated data onto a second set of subcarriers associated with a second resource unit; and transmitting, in the WLAN, an orthogonal frequency division multiplexing (OFDM) symbol including the data modulated onto the first set of subcarriers and the data modulated onto the second set of subcarriers.

2. The method of claim 1 wherein the first set of subcarriers is separated in frequency from the second set of subcarriers by a plurality of intervening subcarriers.

3. The method of claim 1 comprising, prior to modulating using the first modulation type and modulating using the second modulation type:
receiving a data unit transmitted in the WLAN,
selecting the first modulation type and the second modulation type based on information included in the received data unit.

4. The method of claim 1 comprising, prior to parsing the input data, encoding the data according to a first code rate.

5. The method of claim 4 comprising:
prior to modulating using the first modulation type, encoding the data included in the first data stream based on a first code rate; and
prior to modulating using the second modulation type, encoding the data included in the second data stream based on a second code rate.

6. The method of claim 5 comprising:
receiving a data unit transmitted in the WLAN;
selecting the first modulation type and the first code rate based on information included in the received data unit; and
selecting the second modulation type and second code rate based on information included in the received data unit.

7. The method of claim 6 wherein the first modulation type and the second modulation type are each selected from a group of modulation types that includes: binary phase shift keying (BPSK) modulation, quadrature phase shift keying (QPSK) modulation; 16-quadrature amplitude modulation (QAM); 64-QAM; 256-QAM; 1024-QAM; 2048-QAM; and 4096-QAM.

8. The method of claim 6 wherein the received data unit includes information indicating the first modulation type, the first code rate, the second modulation type and the second code rate in a preamble header of the data unit.

9. The method of claim 1 wherein the OFDM symbol is transmitted as part of a physical payload of a data unit.

10. A station for transmitting data in an Orthogonal Frequency-Division Multiple Access (OFDMA) wireless local area network (WLAN), comprising:
a network interface configured to send and receive signals in the WLAN;
a processing device coupled to the network interface;
a non-transitory storage coupled to the processing device and storing thereon instructions that, when executed by the processing device, configure the station to:
parse input data for a receiving station into a first data stream and a second data stream;
modulate, using a first modulation type, data included in the first data stream and map the modulated data onto a first set of subcarriers associated with a first resource unit;
modulate, using a second modulation type, data included in the second data stream and map the modulated data onto a second set of subcarriers associated with a second resource unit; and
transmit, in the WLAN, an orthogonal frequency division multiplexing (OFDM) symbol including the data modulated onto the first set of subcarriers and the data modulated onto the second set of subcarriers.

11. The station of claim 10 wherein the first set of subcarriers is separated in frequency from the second set of subcarriers by a plurality of intervening subcarriers.

12. The station of claim 10 wherein, when executed by the processing device, the instructions configure the station to:
receive a data unit transmitted in the WLAN,
select the first modulation type and the second modulation type based on information included in the received data unit.

13. The station of claim 10 wherein, when executed by the processing device, the instructions configure the station to, prior to parsing the input data, encode the data according to a first code rate.

14. The station of claim 10 wherein, when executed by the processing device, the instructions configure the station to:
select, a first code rate for the first resource unit and a second code rate for the second resource unit;
prior to modulating using the first modulation type, encode the data included in the first data stream based on the first code rate; and
prior to modulating using the second modulation type, encode the data included in the second data stream based on the second code rate.

15. The station of claim 14 wherein, when executed by the processing device, the instructions configure the station to:
receive a data unit transmitted in the WLAN;
select the first modulation type and the first code rate based on information included in the received data unit; and
select the second modulation type and second code rate based on information included in the received data unit.

16. The station of claim 15 wherein the first modulation type and the second modulation type are each selected from a group of modulation types that includes: binary phase shift keying (BPSK) modulation, quadrature phase shift keying (QPSK) modulation; 16-quadrature amplitude modulation (QAM); 64-QAM; 256-QAM; 1024-QAM; 2048-QAM; and 4096-QAM, and the OFDM symbol is transmitted as part of a data unit that includes information indicating the first modulation type, the first code rate, the second modulation type and the second code rate in a preamble header of the data unit.

17. The station of claim 16 wherein the received data unit comprises a header that includes, individually for each of the first and second resource unit, information identifying the first set of subcarriers, the first modulation type, the second set of subcarriers and the second modulation type, and the header includes individual subfields for information identifying the first modulation type and the second modulation type.

18. The station of claim 17 wherein the header further comprises a common modulation type field indicating a base modulation type, the individual subfields each indicating a respective difference relative to the base modulation type, the length of each individual subfield being 3 bits or fewer.

19. A method comprising:
receiving, at a receiving station, a data unit transmitted in wireless local area network (WLAN), the data unit comprising a physical payload that includes an Orthogonal Frequency-Division Multiplexing (OFDM) symbol that has been transmitted in a plurality of resource units used for data modulated according to a respective modulation type, wherein the resource units include a first and second resource unit assigned to the receiving station and further resource units assigned to one or more further receiving stations, the data unit comprising a header that includes, for each of the first and second resource units, information identifying the respective modulation types used to modulate the data transmitted in the first and second resource units, respectively.

20. The method of claim 19 comprising: demodulating and decoding the header of the received data unit to determine respective subcarrier sets associated with the first and second resource units assigned to the receiving station and the respective modulation types used to modulate the data transmitted in the first and second resource units; and demodulating signals on the subcarrier sets associated with the first and second resource units based on the determined modulation types.

21. The method of claim 20 wherein demodulating and decoding the header of the received data unit also determines respective coding rates used to encode the data transmitted in the first and second resource units, the method comprising decoding the demodulated signals corresponding to the first and second resource units based on the determined respective coding rates and combining the decoded and demodulated signals to recover transmitted source words.

22. The method of claim 20 wherein demodulating and decoding the header of the received data unit also determines a coding rate used to encode the data transmitted in the first and second resource units, the method comprising combining the demodulated signals and decoding the combined, demodulated signals based on the determined coding rate and to recover transmitted source words.

* * * * *